United States Patent
Kato et al.

(10) Patent No.: US 10,433,049 B2
(45) Date of Patent: Oct. 1, 2019

(54) SOUND REPRODUCING DEVICE

(71) Applicants: PIONEER CORPORATION, Tokyo (JP); Tohoku Pioneer Corporation, Yamagata (JP)

(72) Inventors: Yoshinao Kato, Yamagata (JP); Toshihiro Kuroda, Yamagata (JP)

(73) Assignees: PIONEER CORPORATION, Tokyo (JP); TOHOKU PIONEER CORPORATION, Yamagata (JP)

( * ) Notice: Subject to any disclaimer, the term of this patent is extended or adjusted under 35 U.S.C. 154(b) by 152 days.

(21) Appl. No.: 15/539,932

(22) PCT Filed: Sep. 15, 2015

(86) PCT No.: PCT/JP2015/076174
§ 371 (c)(1),
(2) Date: Jun. 26, 2017

(87) PCT Pub. No.: WO2016/103810
PCT Pub. Date: Jun. 30, 2016

(65) Prior Publication Data
US 2017/0374450 A1    Dec. 28, 2017

(30) Foreign Application Priority Data
Dec. 26, 2014    (JP) .................... 2014-264512

(51) Int. Cl.
*H04R 3/04*    (2006.01)
*H04R 1/28*    (2006.01)
(Continued)

(52) U.S. Cl.
CPC ........... *H04R 1/2819* (2013.01); *H03G 5/165* (2013.01); *H03G 9/00* (2013.01); *H04R 1/2869* (2013.01);
(Continued)

(58) Field of Classification Search
CPC ...... H04R 1/2819; H04R 1/2869; H04R 3/04; H04R 2499/13; H03G 5/165; H03G 9/00; H03G 3/00
See application file for complete search history.

(56) References Cited

U.S. PATENT DOCUMENTS 9,236,842 B2 *    1/2016    Katsianos ............... H03G 3/00
2009/0052695 A1    2/2009    Yamada et al.

FOREIGN PATENT DOCUMENTS

JP    11-017480    1/1999
JP    2000-138999    5/2000
(Continued)

OTHER PUBLICATIONS

Hideki, Hirozawa. Translation of Japanese Patent Application Publication 2005197842 (Year: 2005).*

(Continued)

*Primary Examiner* — Brian Ensey
(74) *Attorney, Agent, or Firm* — Young & Thompson

(57) ABSTRACT

A sound-reproducing device has a DSP and a μCom performing a predetermined calculation to an input signal, and an AMP amplifying the calculated signal and outputting the signal to a speaker unit. The DSP and the μCom cuts a part of a reverse characteristic of a frequency characteristic of the speaker unit in a low frequency, and superimposes the reverse characteristic on the input signal. The sound-reproducing device can overcome a shortage of low sound during reproduction of low to medium volume in the speaker unit having a relatively small diameter, and can keep reproduction sound quality without loss of the reproduction sound quality during reproduction of large volume.

13 Claims, 13 Drawing Sheets

(51) Int. Cl.
  *H03G 9/00* (2006.01)
  *H03G 5/16* (2006.01)
  *H03G 3/00* (2006.01)
(52) U.S. Cl.
  CPC ............... *H04R 3/04* (2013.01); *H03G 3/00* (2013.01); *H04R 2499/13* (2013.01)

(56) References Cited

FOREIGN PATENT DOCUMENTS

| | | |
|---|---|---|
| JP | 2005-197842 | 7/2005 |
| JP | 2009-055079 | 3/2009 |
| WO | WO 2011/083610 | 7/2011 |

OTHER PUBLICATIONS

Japanese Office Action for Application No. 2016-565965, dated Oct. 2, 2018, with English translation provided.
Kawakami, F., et al., "Development of Acoustically Interactive Car Communication System," Transactions of Information Processing Society of Japan, vol. 48, No. 12, Dec. 2007, pp. 3836-3848, with Partial English Translation.
Japanese Office Action issued in Application No. 2016-565965, dated Feb. 13, 2018 with English Translation.
International Search Report issued in Application No. PCT/JP2015/076174, dated Nov. 24, 2015.
International Search Report, PCT/JP2015/076174, dated Nov. 24, 2015.

* cited by examiner

FIG.20A

1/3 octave ADJUSTMENT

| freq(Hz) | 20 | 25 | 32 | 40 | 50 | 63 | 80 | 100 | 125 | 160 |
|---|---|---|---|---|---|---|---|---|---|---|
| Gain(dB) | -0.2 | -1.3 | -0.6 | 1.1 | -0.9 | 1.7 | -0.1 | -0.8 | 0.4 | -0.7 |

FIG.20B

1/6 octave ADJUSTMENT

| freq(Hz) | 20 | 23 | 25 | 29 | 32 | 36 | 40 | 45 | 50 | 56 |
|---|---|---|---|---|---|---|---|---|---|---|
| Gain(dB) | -0.2 | -0.9 | -1.3 | -1.3 | -0.6 | 0.8 | 1.1 | -0.2 | -0.9 | -0.3 |

| freq(Hz) | 63 | 71 | 80 | 90 | 100 | 113 | 125 | 140 | 160 | 180 |
|---|---|---|---|---|---|---|---|---|---|---|
| Gain(dB) | 1.7 | -0.8 | -0.1 | 3.1 | -0.8 | -2 | 0.4 | 0.9 | -0.7 | 10.2 |

SOUND REPRODUCING DEVICE

TECHNICAL FIELD

The present invention relates to a sound-reproducing device.

RELATED ART

For example, it is preferable that a speaker unit mounted on a vehicle such as an automobile is as light and compact as possible from a viewpoint of energy saving. However, in the speaker unit with a relatively small diameter, particularly low-pitched sound is insufficient as compared with a speaker unit with a relatively large diameter. In a frequency characteristic of the speaker unit with a relatively small diameter, there is a case that for example at 100 Hz or less a sound pressure is steeply lowered compared with the speaker unit with a relatively large diameter. For this reason, especially low-pitched sound becomes insufficient during reproduction of small to medium volume.

In order to compensate for the lack of low-pitched sound of the speaker unit having a relatively small diameter, there is a method of amplifying a low sound signal by using an amplifying device (amplifier) and outputting the signal. For example, in Patent Literature 1, when a music component such as a base or drum that a frequency characteristic is desired to be adjusted is relatively large, a boost amount of low frequency (bass) is increased.

Patent Literature 1: JP H11-17480 A

SUMMARY OF THE INVENTION

However, when a low-pitched sound is greatly outputted by an amplifying device during reproduction of loud volume, the signal from the amplifying device is too large in a speaker unit, and thereby abnormal noise is generated. As a result, the quality of the reproduction sound becomes impaired.

Herein, in consideration of the problem described above, an object of the present invention is to provide a sound-reproducing device, for example in a speaker unit having a relatively small diameter, which can overcome a shortage of low sound during reproduction of low to medium volume and can maintain the quality of reproducing sounds without loss of that quality during reproduction of loud volume.

In order to solve the above issue, the present invention according to a first aspect is a sound-reproducing device including: an arithmetic device calculating an input signal; and an amplifying device amplifying the calculated signal and outputting the signal to a speaker unit. The arithmetic device superimposes a reverse characteristic of an output sound pressure frequency characteristic of the speaker unit on the input signal.

Further, the present invention is a reproducing method of a sound-reproducing device including: a calculation process for performing a calculation of an input signal; and an amplification process for amplifying the calculated signal via an amplifying device and outputting the signal to a speaker unit. The amplification process performs a calculation for superimposing a reverse characteristic of an output sound pressure frequency characteristic of the speaker unit on the input signal.

Further, the present invention is a reproduction program of the sound-reproducing device that makes a computer execute the reproduction method.

Furthermore, the present invention is a storage medium readable by a computer to store the reproduction program of the sound-reproducing device.

BRIEF DESCRIPTION OF THE DRAWINGS

FIGS. 20A and 20B are examples of adjustment parameters of a graphic equalizer;

DESCRIPTION OF THE PREFERRED EMBODIMENT

Figure 1:
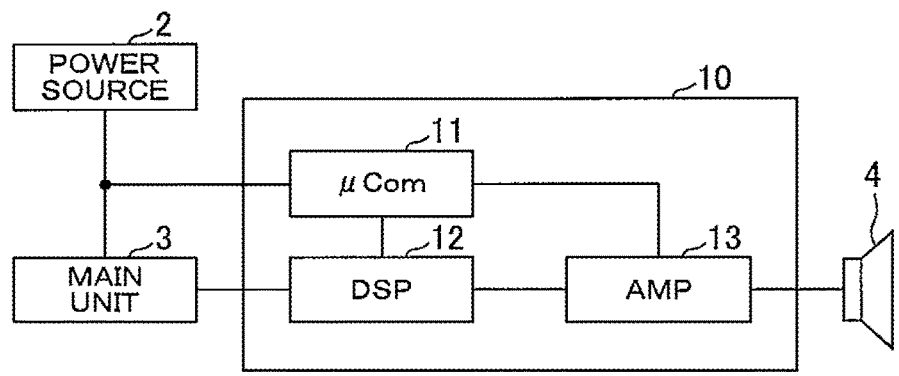
FIG. 1 is a block configuration diagram of a sound-reproducing system having a sound-reproducing device according to a first embodiment of the present invention.

Hereafter, a sound-reproducing device according to a first embodiment of the present invention will be explained. The sound-reproducing device according to the first embodiment of the present invention has an arithmetic device for calculating an input signal, and an amplifying device for amplifying the calculated signal and outputting the signal to a speaker unit. The arithmetic device superimposes a reverse characteristic of an output sound pressure frequency characteristic of the speaker unit on the input signal. Thereby, the output sound pressure frequency characteristic of the speaker unit can be flat based on the reverse characteristic of the output sound pressure frequency characteristic of the speaker unit, and a shortage of low sound can be eliminated.

Further, the arithmetic device may cut a part of the output sound pressure frequency characteristic in a low frequency. Thereby, generation of abnormal noises caused from an input signal exceeding the maximum output sound pressure in which the speaker unit is able to continually emit sounds can be prevented. Therefore, the quality of reproduction sounds during reproduction of large volume can be maintained without loss of the quality.

Further, an upper limit frequency value in the part of the output sound pressure frequency characteristic to be cut may be made small as an amplification factor of the amplifying is small. Thereby, abnormal noise is not generated from the speaker unit in a low frequency as the amplification factor becomes smaller. For this reason, it is possible to reproduce low sound without loss of the quality of reproduction sound. Therefore, the shortage of low sound can be overcome in small volume.

Further, the upper limit frequency value in the part of the output sound pressure frequency characteristic to be cut may be 100 Hz. Thereby, in particular, it is possible to correspond to a speaker unit for reproducing a low frequency.

Further, the reverse characteristic may be a reverse characteristic of the output sound pressure frequency characteristic of the speaker unit in the vehicle interior. Thereby, it is possible to adjust the frequency characteristic depending on a vehicle in which the speaker unit is installed.

Furthermore, the arithmetic device may add correction information based on the output sound pressure frequency characteristic in the vehicle interior to the reverse characteristic. Thereby, a correction can be performed in view of the reverse characteristic based on the characteristic of the speaker unit as well as influence of standing wave due to a vehicle shape. Therefore, when the speaker unit is mounted in a vehicle, the frequency characteristic of the speaker unit can come close to flat.

Further, a slope of the reverse characteristic of the output sound pressure frequency characteristic of the speaker unit in the vehicle interior is smaller than that of the reverse characteristic of the output sound pressure frequency characteristic of the speaker unit in a free sound field in a predetermined low frequency range. Since there is such slope, the frequency characteristic of the speaker unit can come close to flat by using the reverse characteristic matched with the characteristic in the vehicle interior (pressure sound field) instead of directly the reverse characteristic based on the result measured in a free sound field.

Further, the above described sound-reproducing device may be arranged on a mobile object. Thereby, in the mobile object such as a vehicle, the output sound pressure frequency characteristic of the speaker unit can be made flat, and the shortage of low sound can be overcome.

Furthermore, a reproducing method of the sound-reproducing device according to the first embodiment of the present invention includes a calculation process for performing a calculation of an input signal; and an amplification process for amplifying the calculated signal via an amplifying device and outputting the signal to a speaker unit. The amplification process performs a calculation for superimposing a reverse characteristic of an output sound pressure frequency characteristic of the speaker unit on the input signal. Thereby, the output sound pressure frequency characteristic of the speaker unit can be made flat based on the reverse characteristic of the output sound pressure frequency characteristic of the speaker unit, and the shortage of boss can be eliminated.

Further, the amplification may perform a calculation for cutting a part of the output sound pressure frequency characteristic in a low frequency. Thereby, generation of abnormal sound caused from an input signal exceeding the maximum output sound pressure in which the speaker unit is able to continually emit sounds can be prevented. Therefore, the quality of reproduction sounds during reproduction of large volume can be maintained without loss of the quality.

Further, a reproduction program of the sound-reproducing device may make a computer execute the above described reproducing method. Thereby, the output sound pressure frequency characteristic of the speaker unit can be made flat based on the reverse characteristic of the output sound pressure frequency characteristic of the speaker unit by using a computer, and the shortage of low sound can be overcome.

Further, the reproduction program of the above sound-reproducing device may be stored in a storage medium readable by a computer. Thereby, in addition to incorporating the program into a device, it can be distributed as a single unit. Moreover, version upgrade can be easily performed.

First Embodiment

A sound-reproducing device according to a first embodiment of the present invention will be explained with reference to FIGS. 1 to 7. FIG. 1 shows a sound reproduction system 1 having a sound-reproducing device 10 of the embodiment of the present invention.

The sound reproduction system 1 has a power source 2, a MAIN UNIT 3, a speaker unit 4, and a sound-reproducing device 10.

The power source 2 converts a power-supply voltage from an external battery or battery own into a direct voltage, and supplies the direct voltage to the MAIN UNIT 3 and the sound-reproducing device 10.

The MAIN UNIT 3 is a device for outputting a sound signal of, for example a CD (Compact Disc) player, a memory audio, a radio receiver and so on to the sound-reproducing device 10.

The speaker unit 4 includes for example a subwoofer. Further, the speaker unit 4 is not limited to the subwoofer. The speaker unit 4 may be a woofer or full-range.

The sound-reproducing device 10 has a μCom 11, a DSP 12, and an AMP 13. The μCom 11 controls the sound-reproducing device 10, and is a well-known microcomputer having a CPU (Central Processing Unit), a ROM (Read Only Memory), a RAM (Random Access Memory) and the like.

The DSP 12 calculates a sound signal inputted from the MAIN UNIT 3 based on control from the μCom 11. The DSP 12 is a microprocessor specialized for digital single processing calculation as well known, and has arithmetic units for processing the CPU, ROM, RAM and signals inside. The DSP 12 outputs a signal after calculated to the AMP 13.

In the embodiment of the present invention, the arithmetic device includes the μCom 11 and the DSP 12. Further, the arithmetic device may has only the μCom 11, or only the DSP 12. The sound signal becomes an input signal inputted in the arithmetic device, and the input signal is operated in the DSP 12. Further, an output signal of the DPS 12 becomes a signal operated in the arithmetic device.

The AMP 13 is an amplifying device for amplifying a signal inputted from the DSP 12 at a predetermined amplification for example based on a volume not shown and for outputting the signal to the speaker unit 4. The AMP 13 may be an analog amplifier with a digital/analog converter, and a digital amplifier.

Figure 2:
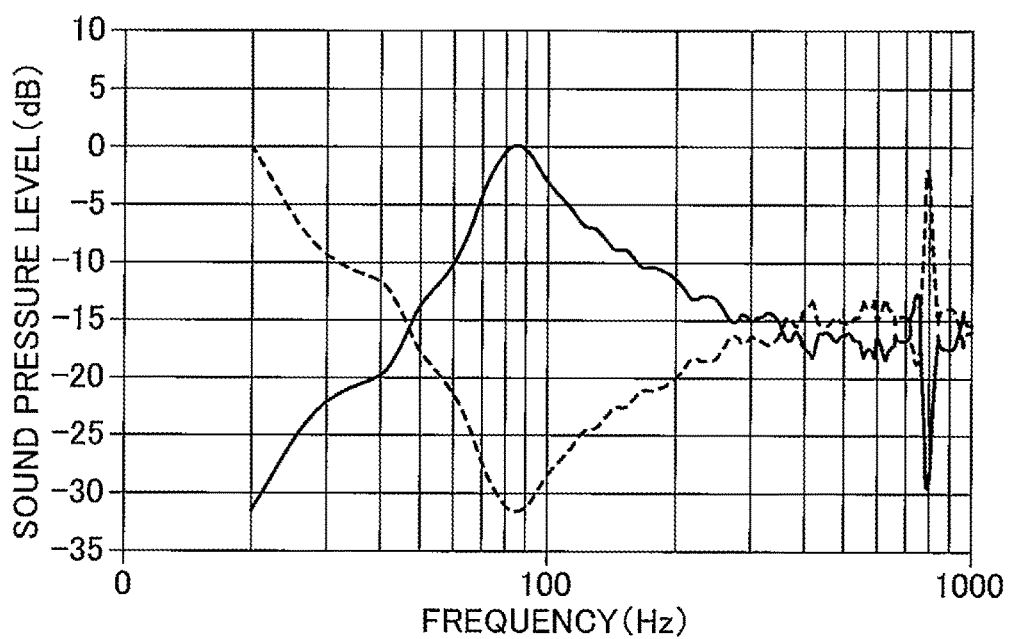
FIG. 2 is a graph showing an example a frequency characteristic of a speaker unit shown in FIG. 1 and a reverse characteristic thereof.

Here, a calculation performed by the DSP 12 will be illustrated with reference to FIGS. 2 to 6. FIG. 2 is a graph showing an output sound pressure frequency characteristic of the speaker unit 4 and a reverse characteristic thereof. In FIG. 2, a vertical axis is an output sound pressure level, and a horizontal axis is a frequency.

The speaker unit 4 shows the output sound pressure frequency characteristic as shown by a solid line of FIG. 2. In this case, the output sound pressure level is lowered at a low frequency of about 80 Hz or less. Here, a filter processing of the reverse characteristic is performed as shown by a dashed-line of FIG. 2. It is possible to improve the characteristic of especially low frequency for example by adding (superimposing) a frequency signal of the reverse characteristic to the sound signal inputted from the MAIN UNIT 3 to flatten the output sound pressure frequency characteristic emitted from the speaker unit 4.

The output sound pressure frequency characteristic of the speaker unit 4 is previously measured, and the reverse characteristic is generated from the measured result. Then, the reverse characteristic information is stored in a memory of the DSP 12. The DSP 12 adds (superimposes) the stored frequency signal of the reverse characteristic to the sound signal inputted from the MAIN UNIT 3.

Figure 3:
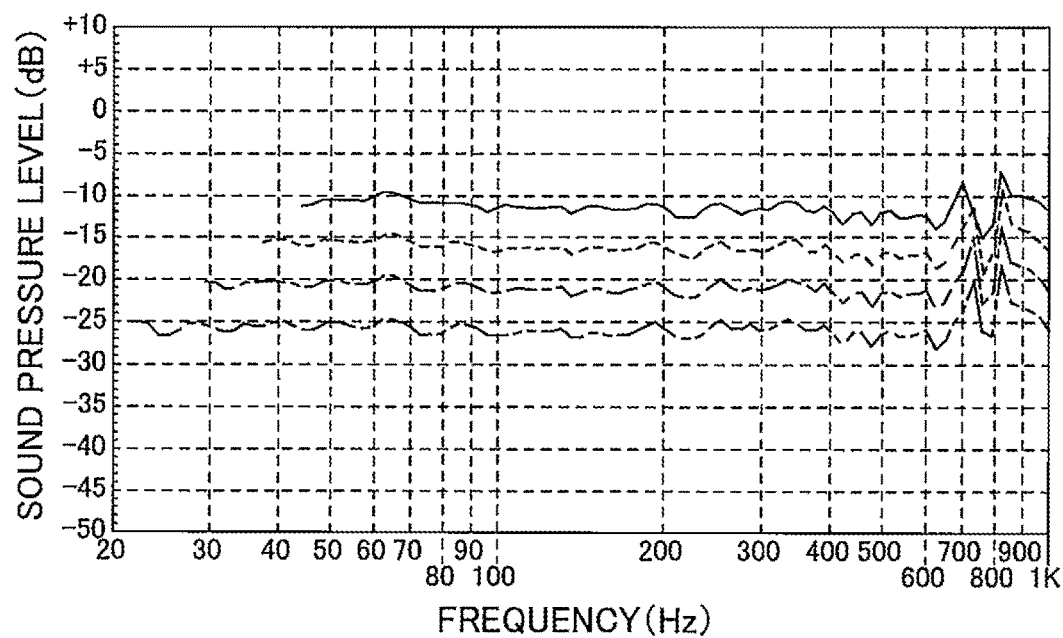
FIG. 3 is a graph showing a frequency characteristic with respect to an input signal level of the speaker unit shown in FIG. 1.

Meanwhile, if the characteristic information is kept as the reverse characteristic shown in FIG. 2, a signal exceeding the maximum output sound pressure in which the speaker unit 4 can continuously emit sounds is inputted, and thereby abnormal noise may be generated. One example is shown in FIG. 3. FIG. 3 is the output sound pressure frequency characteristic to an input single level of the speaker unit 4, and shows an output sound pressure level on a vertical axis and a frequency on a horizontal axis. A solid line is the input signal level of −5 dBV, a dashed-line is the input single level of −10 dBV, a one-dot chain line is the input single level of −15 dBV, and a two-dot chain line is the input signal level of −20 dBV.

In FIG. 3, frequencies below a predetermined frequency are not plotted in each of the input signal level. It shows that abnormal sound is generated because in the frequencies below the predetermined frequency the signal exceeding the maximum output sound pressure at which the speaker unit 4 is able to continually emit sounds is input. The frequency in which this abnormal noise is generated is made small as the input single level becomes small.

For example, when a diaphragm of the speaker unit 4 vibrates with large amplitude, a voice coil comes into collision with a poll yoke in a magnetic gap and thereby the abnormal noise is generated. In other words, as the input signal level of the speaker unit is larger, abnormal noise tends to occur. For this reason, as an amplification factor in the AMP 13 is larger, abnormal noise tends to occur.

Figure 4:
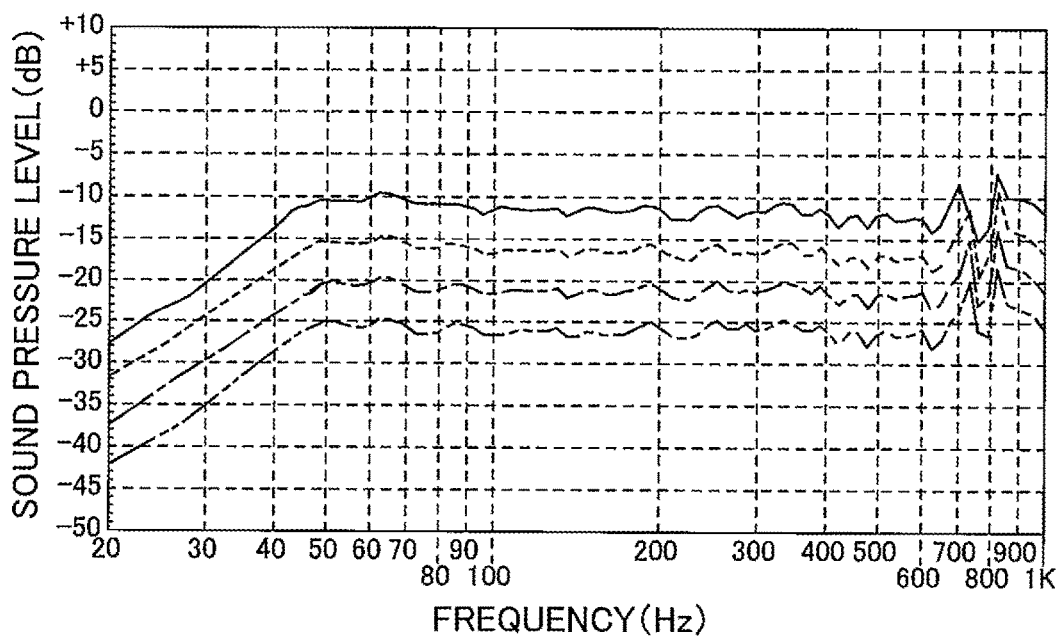
FIG. 4 is a graph showing a frequency characteristic with respect to an input signal level of the speaker unit shown in FIG. 1.

FIG. 4 is the output sound pressure frequency characteristic of the speaker unit to several different-sized input signal level in a state that the reverse characteristic shown in FIG. 2 is not added. In the characteristic shown by a solid line, the output sound pressure level begins to falling to −10 dB at about 45 Hz or lower, and then decreases to −28 dB at 20 Hz. In the characteristic shown by a dashed line, the output sound pressure level begins to falling to −15 dB at about 45 Hz or lower, and then decreases to −32 dB at 20 Hz. In the characteristic shown by a one-dot chain line, the output sound pressure level begins to falling to −20 dB at about 45 Hz or lower, and decreases to −37 dB at 20 Hz. In the characteristic shown by a two-dot chain line, the output sound pressure level begins to falling to −25 dB at about 45 Hz or lower, and decrease to −42 dB at 20 Hz.

In each case, the output sound pressure level is lowered when the frequency is about 45 Hz. For this reason, when the output sound pressure level is small, only sound pressure not satisfied to the maximum sound pressure which can be output by the speaker is outputted. As a result, in particular, when reproducing at a small sound, a user feels low sound shortage.

Figure 5:
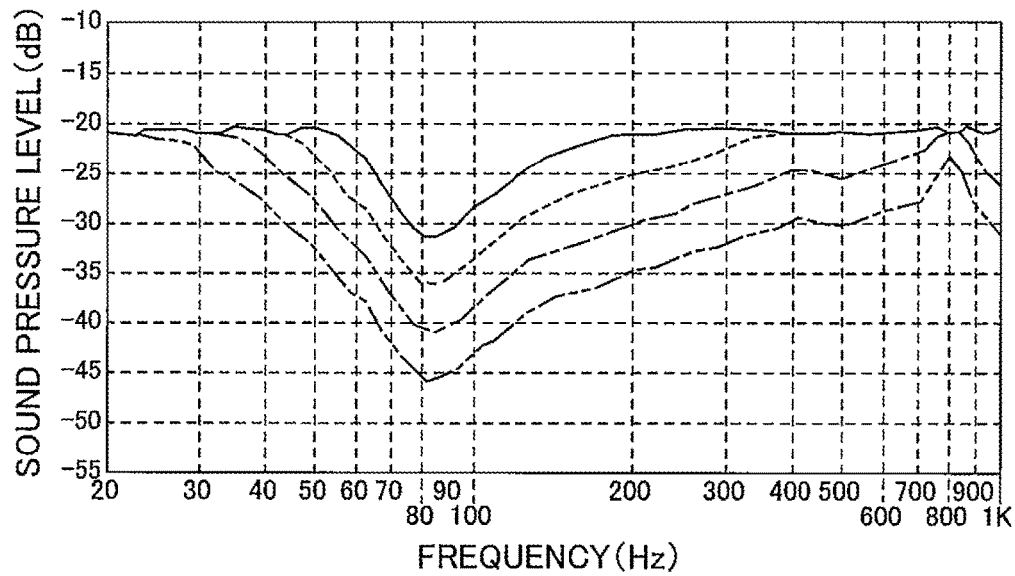
FIG. 5 is a graph showing the reverse characteristic for each of the input signal level of the speaker unit shown in FIG. 1.

So, in the embodiment of the present invention, a predetermined frequency or less among the reverse characteristic is cut, and a signal over the maximum output sound pressure in which the speaker unit 4 can continuously emit sounds is not inputted. In other words, a part of the output sound pressure frequency characteristic in a low frequency is cut. FIG. 5 shows an example of the reverse characteristic for each of the input signal level. In the example of FIG. 5, about 55 Hz or less is cut according to the level of the reverse characteristic signal.

Further, the frequency signal of the reverse characteristic in which the low frequency is cut is superimposed on a sound signal inputted from the MAIN UNIT 3. As one example of a calculation at this time, a prescribed weighting is added to each of the frequency signal of the reverse characteristic in which the low frequency is cut and the sound signal inputted from the MAIN UNIT 3. Thereafter, the superimposed output signal is inputted to the AMP 13.

Figure 6:
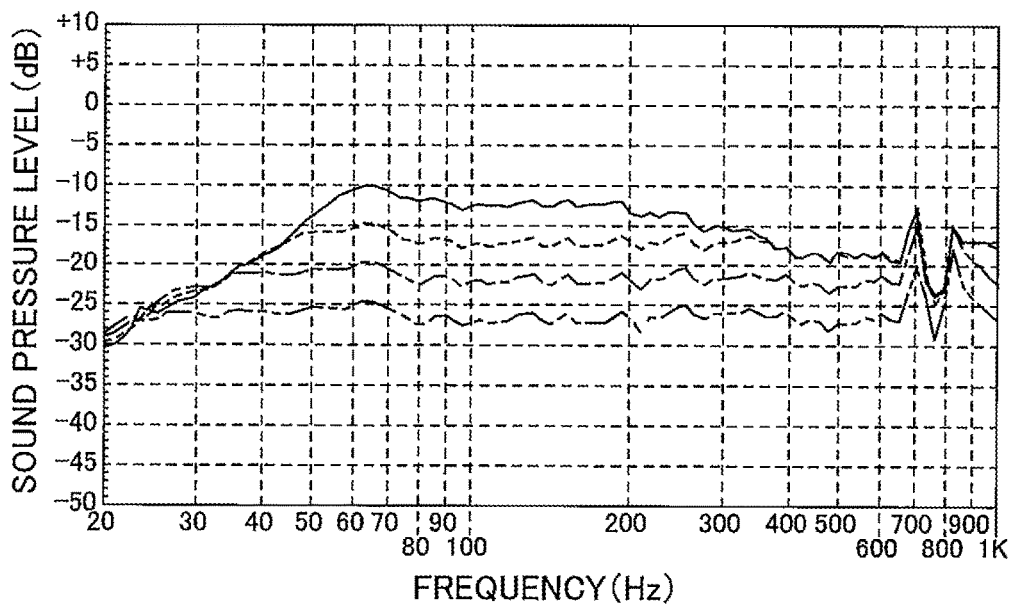
FIG. 6 is a graph showing a frequency characteristic with respect to an input signal level after calculated in the sound-reproducing device of the speaker unit shown in FIG. 1.

One example of the output sound pressure frequency characteristic emitted from the speaker unit 4 through the AMP 13 after superimposing the frequency signal of the reverse characteristic in which the low frequency is cut and the sound signal having the output sound pressure frequency characteristic inputted from the MAIN UNIT 3 is shown in FIG. 6. In this example, the output sound pressure frequency characteristic inputted from the MAINT UNIT 3 is flat over all of frequencies. In the case of FIG. 6, about 65 Hz-35 Hz or less is cut according to the input signal level. Thereby, the output sound pressure level decreases in the cutting frequency or less according to the characteristic of the speaker unit 4, and generation of abnormal sound can be prevented.

Thus, in the embodiment of the present invention, an upper limit frequency value to be cut in the reverse characteristic is changed depending on an amplification factor of the AMP 13. For example, as shown in FIG. 6, when the input signal level is the amplification factor corresponding to −5 dBV, for example 65 Hz or less is cut. Further, when the input signal level is the amplification factor corresponding to −10 dBV, for example 40 Hz or less is cut. When the input signal level is he amplification factor corresponding to −15 dBV, for example 35 Hz or less is cut. Thereby, the upper limit frequency value to be cut can be made small as the amplification factor of the AMP 13 is small. Furthermore, when the amplification factor is a predetermined value or less, it is not necessary to cut the frequency. For example, when the sound pressure level is −20 dBV or less shown in FIG. 6, abnormal sound would be not generated even if not cutting the frequency. In such case, cutting is not performed.

More specifically, in characteristic information, the upper limit frequency value in a part of the low frequency to be cut among the reverse characteristic of the output sound pressure frequency characteristic in the speaker unit 4 is made small as the amplification factor of the AMP 13 is smaller. Thereby, although the amplification factor of the AMP 13 is small, the sound pressure level of the low frequency extends to a lower frequency. As a result, low sound shortage is solved to an appreciable extent.

Further, the upper limit frequency value in a part of the low frequency to be cut may be changed in a range of 100 Hz or less in an audible frequency band. The 100 Hz is a value set based on the frequency in which abnormal sound is generated for example at the maximum amplification factor, and is a preferable value in the case of a subwoofer. Of course, 100 Hz, 65 Hz and the like may appropriately be changed based on the output sound pressure frequency characteristic of the target speaker unit. In the embodiment of the present invention, the characteristic of the low frequency is improved in the output sound pressure frequency characteristic of the speaker unit, and the upper limit frequency value in the part of the low frequency to be cut may be set according to the frequency in which the characteristic of the low frequency in the target speaker unit are deteriorated.

Figure 7:
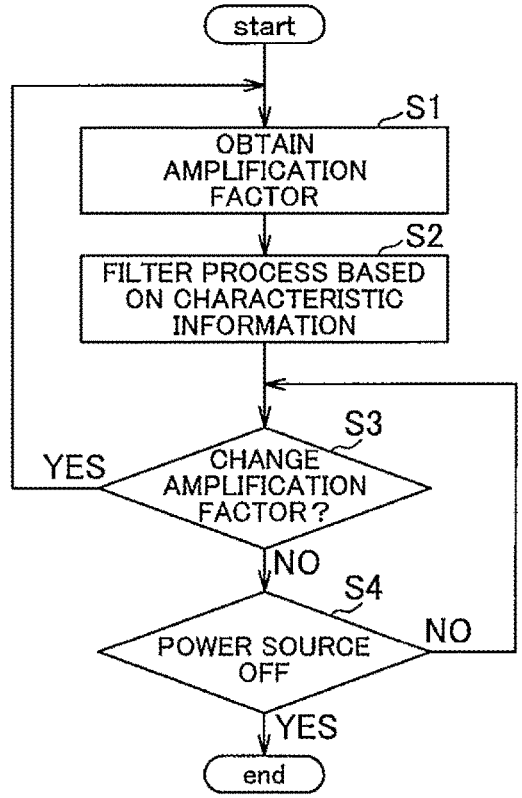
FIG. 7 is a flowchart of an operation of the sound-reproducing device shown in FIG. 1.

Next, an operation of the sound-reproducing device 10 including the above structure (a reproducing method of the sound-reproducing device) will be explained with reference to a flowchart of FIG. 7. The flowchart shown in FIG. 7 is operated by executing a reproduction program of the sound-reproducing device stored in a ROM of the μCOM 11 on a CPU of the μCOM 11.

Firstly, in step S1, the μCOM 11 obtains the amplification factor from the AMP 13. Next, in step S2, the μCOM 11 performs a calculation adding (superimposing) a reverse characteristic signal according to the amplification factor obtained in step S1 to a sound signal. Here, a plurality of types of the reverse characteristic signals according to the amplification factor are stored in a memory of the DSP 12 as a data etc. Alternatively, only one amplification factor (for example, maximum value) is stored, and the reverse characteristic signal may be generated by multiplying a predetermined coefficient or the like according to the amplification factor to it.

Next, in step S3, the μCOM 11 determines whether the amplification factor of the AMP 13 is changed or not. When the AMP 13 is changed (in case of YES), the processing returns to step S1. When the AMP 13 is not changed (in case of NO), the processing proceeds to step S4.

Next, in step S4, the μCOM 11 determines whether the power supply is turned OFF or not. When the power supply is turned OFF (in case of YES), the processing is ended. When the power supply is not turned OFF (in case of NO), the processing returns to step S3.

According to the embodiment of the present invention, the sound-reproducing device 10 has the DSP 12 and the μCOM 11 for calculating the input signal, the AMP 13 for amplifying the calculated signal and outputting the signal to the speaker unit. The DSP 12 and the μCOM 11 cut a part of the reverse characteristic of the output sound pressure frequency characteristic of the speaker unit 4 in a low frequency, and add (superimpose) it to the input signal. Thereby, the output sound pressure frequency characteristic of the speaker unit 4 can be flat based on the reverse characteristic of the output sound pressure frequency characteristic of the speaker unit 4, and a shortage of low sound can be improved. Further, by cutting a part of the low frequency in the reverse characteristic, generation of abnormal noises caused from an input signal exceeding the maximum output sound pressure in which the speaker unit 4 is able to continually emit sounds can be prevented. Thus, quality of reproduction sounds during reproduction of large volume can be prevented from being losing.

Further, the upper limit frequency of the part of the low frequency to be cut among the reverse characteristic of the output sound pressure frequency characteristic of the speaker unit 4 is made small as the amplification factor of the AMP 13 is small. Thereby, it is more difficult to generate abnormal noise from the speaker unit 4 as the amplification factor becomes smaller. As a result, low sound can be reproduced without loss of the quality of reproduction sound. Therefore, the shortage of low sound can be eliminated in small volume.

Furthermore, as the speaker unit 4 of the embodiment of the present invention, a subwoofer is used. Thereby, in the subwoofer, the shortage of low sound can be solved in reproduction of small to medium volume, and generation of abnormal sounds can be prevented during reproduction of large volume.

Also, the output sound pressure frequency characteristic of the speaker unit 4 which becomes a base of characteristic information may use a value measured in the time of development of the speaker unit 4. Meanwhile, for example the output sound pressure frequency characteristic may be obtained based on a value measured in a state that the speaker unit 4 is placed in a space such as a room, and then a reverse characteristic may be generated. The output sound pressure frequency characteristic of the speaker unit 4, for example, is measured by inputting a predetermined measurement signal to the speaker unit 4 and collecting sounds emitted from the speaker unit 4 by a microphone. Thereby, the measured value can be matched to the output sound pressure frequency characteristic according to a space in which the speaker unit 4 is placed.

Second Embodiment

Next, a sound-reproducing device according to a second embodiment of the present invention will be explained with reference to FIGS. 8 to 23. Further, the same numeral reference is assigned to the same part as the first embodiment described above, and the description thereof is therefore omitted.

The sound-reproducing device 10 described in the first embodiment can be mounted on a mobile body such as a vehicle. However, the inventor was found by experiment that the output sound pressure characteristic cannot be flat in a vehicle interior even if the reverse characteristic is superimposed as shown in the first embodiment.

Figure 8:
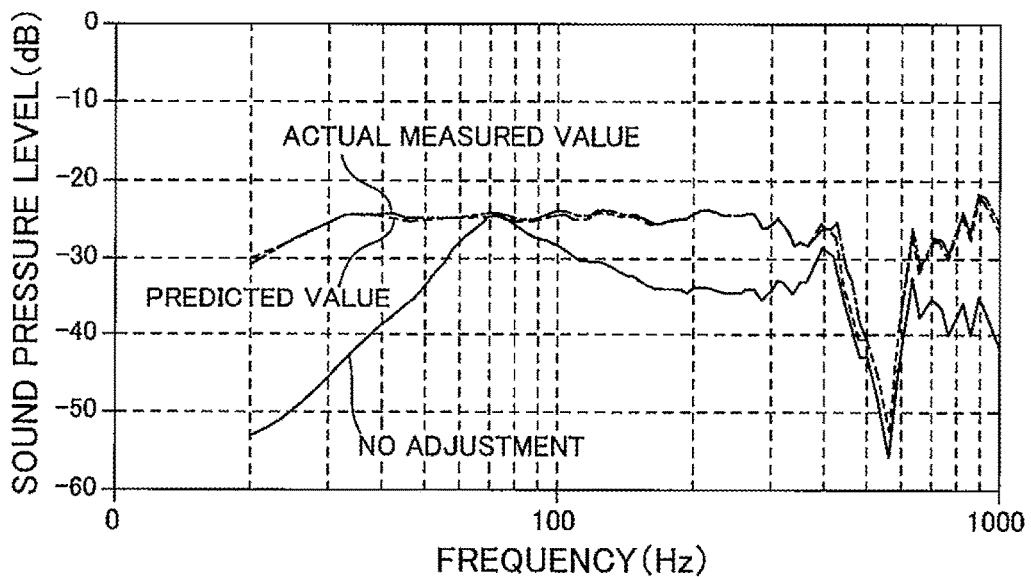
FIG. 8 is a graph of an output sound pressure frequency characteristic with respect to an input signal level of the speaker unit in a free sound field.

FIG. 8 is a graph of the output sound pressure frequency characteristic for the input signal level of the speaker unit 4 in a free sound field. Here, the free sound field is generally a sound field capable of ignoring effects of border in an isotropic and homogeneous medium. In the embodiment of the present invention, the free sound field means a space such as a free-field room or rooms in building larger than a vehicle interior of a vehicle and a space being less affected by reflections. A solid line in FIG. 8 shows the output sound pressure frequency characteristic of the speaker unit 4 when an adjustment of the method explained in the first embodiment (hereafter, it is referred as a first adjustment) is not performed. A dashed line in FIG. 8 shows a predicated value of the output sound pressure frequency characteristic adding the first adjustment, and a one-dot chain line in FIG. 8 shows an actual measured value of the output sound pressure frequency characteristic adding the first adjustment.

Figure 9:
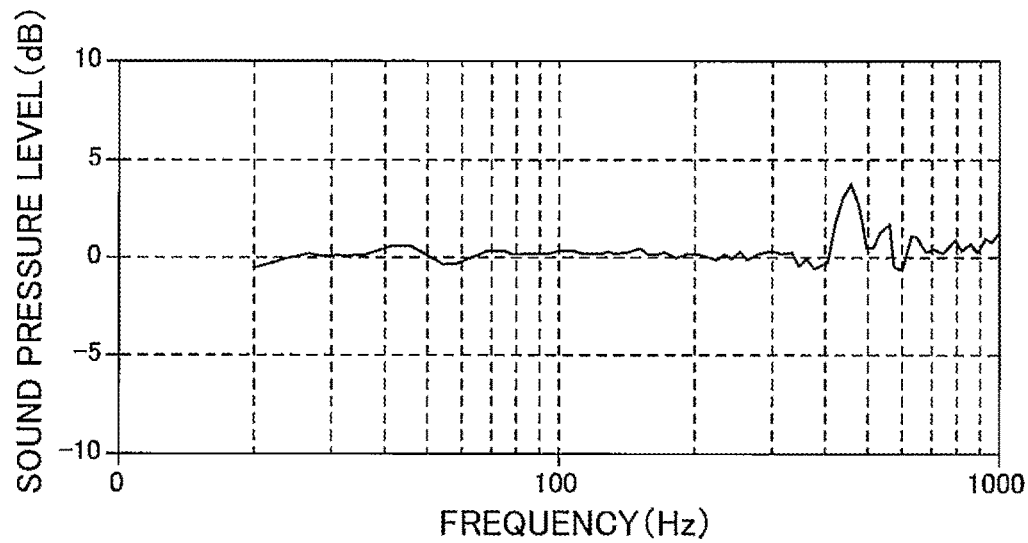
FIG. 9 is a graph showing a difference between a dashed line and a one-dot chain line in FIG. 8.

FIG. 9 is a graph showing a difference between a dashed line and a one-dot chain line. As shown in FIG. 9, a large difference between the predicated value and the actual measured value is not found in the low frequency (about 300 Hz or less).

Figure 10:
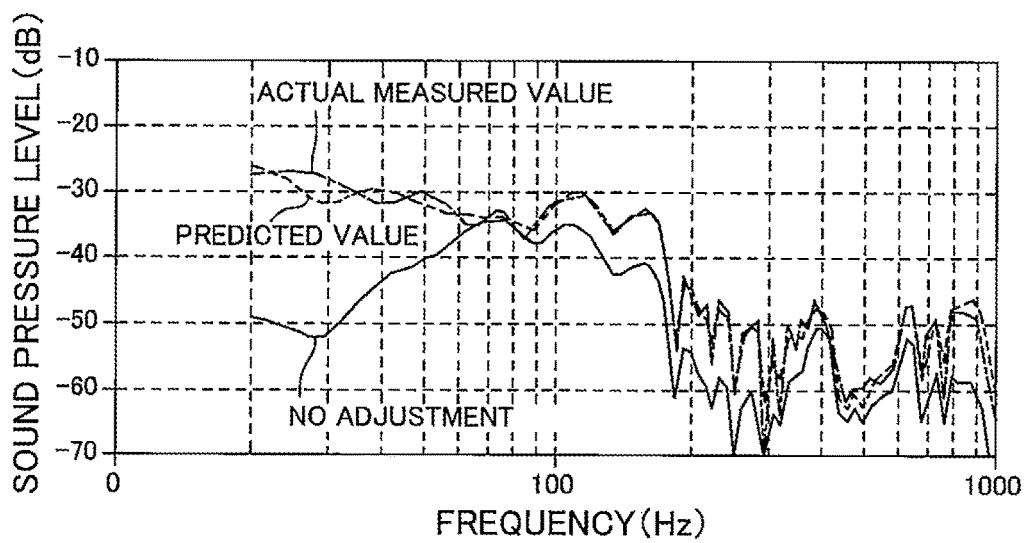
FIG. 10 is a graph of the output sound pressure frequency characteristic with respect to an input signal level of the speaker unit in a vehicle interior (pressure sound field)

FIG. 10 is a graph of the output sound pressure frequency characteristic with respect to the input signal lever of the speaker unit 4 in the vehicle interior (pressure sound field). A solid line in FIG. 10 shows the output sound pressure frequency characteristic of the speaker unit 4 when the first adjustment is performed. A dashed line shows a predicted value of the output sound pressure frequency characteristic adding the first adjustment, and a one-dot chain line shows an actual measured value of the output sound pressure frequency characteristic adding the first adjustment.

Figure 11:
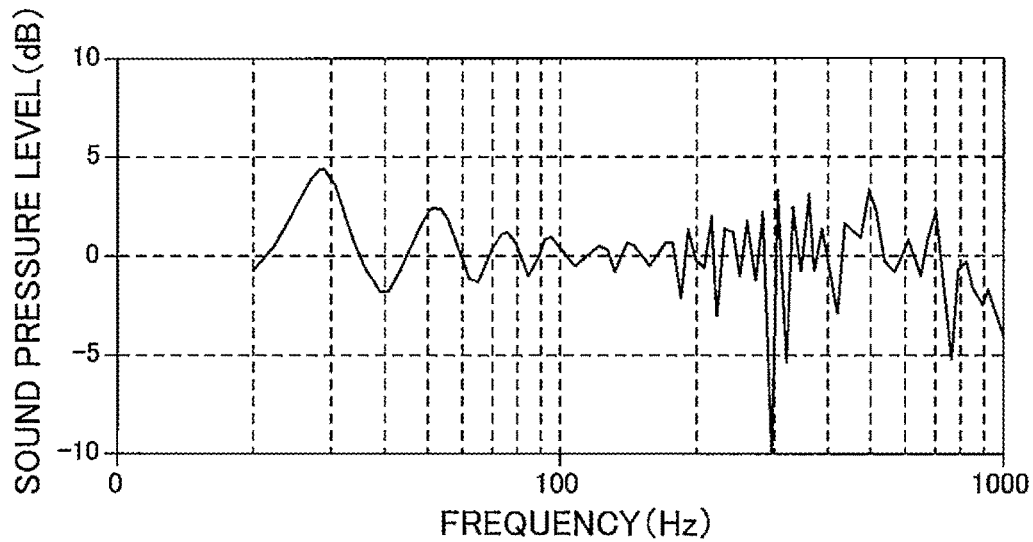
FIG. 11 is a graph showing a difference between a dashed-line and a one-dot chain line in FIG. 10.

FIG. 11 is a graph showing a difference between a dashed-line and a one-dot chain line in FIG. 10. As shown in FIG. 11, an undulation of amplitude occurs in the low frequency (about 200 Hz or less) between the predicted value and the actual measured value. Hereafter, this undulation is referred as an undulation component.

This undulation component is considered to be due to the influence of the shape of the vehicle interior being an enclosed space or the influence of a standing wave when a sound emitted from the speaker unit 4 reflects in the vehicle interior. Therefore, when the sound-reproducing device 10 is installed in the vehicle interior, it is clear that it is impossible to flatten out the output sound pressure even if the reverse characteristic is simply superimposed by influence of the undulation component. For this reason, in the embodiment of the present invention, an adjustment including a correct with consideration for the undulation component is performed.

Figure 12:
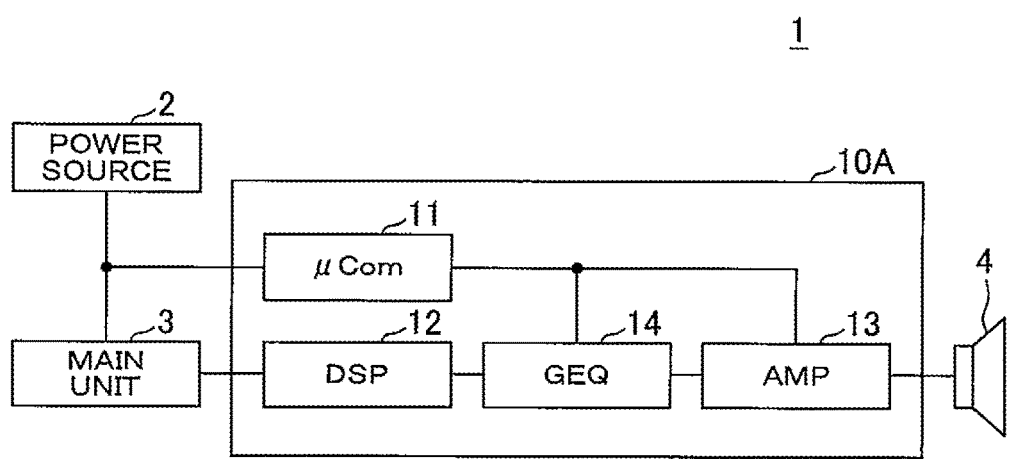
FIG. 12 is a block configuration diagram of a sound-reproducing device according to a second embodiment of the present invention.

FIG. 12 shows a block configuration diagram of the sound-reproducing system 10A according to the embodiment of the present invention. In the sound-reproducing system 10A shown in FIG. 12, a graphic equalizer (GEQ) 14 is added to the configuration shown in FIG. 1. The graphic equalizer 14 adjusts the output of the DSP 12 so as to increase or decrease the output sound pressure level for example with respect to each ⅓ octave or each ⅙ octave, and outputs it the AMP 13. Also, the sound-reproducing system 10A is for example placed under a seat of the vehicle interior or in the vehicle interior near the MAIN UNIT 3 and the speaker unit 4.

Figure 13:
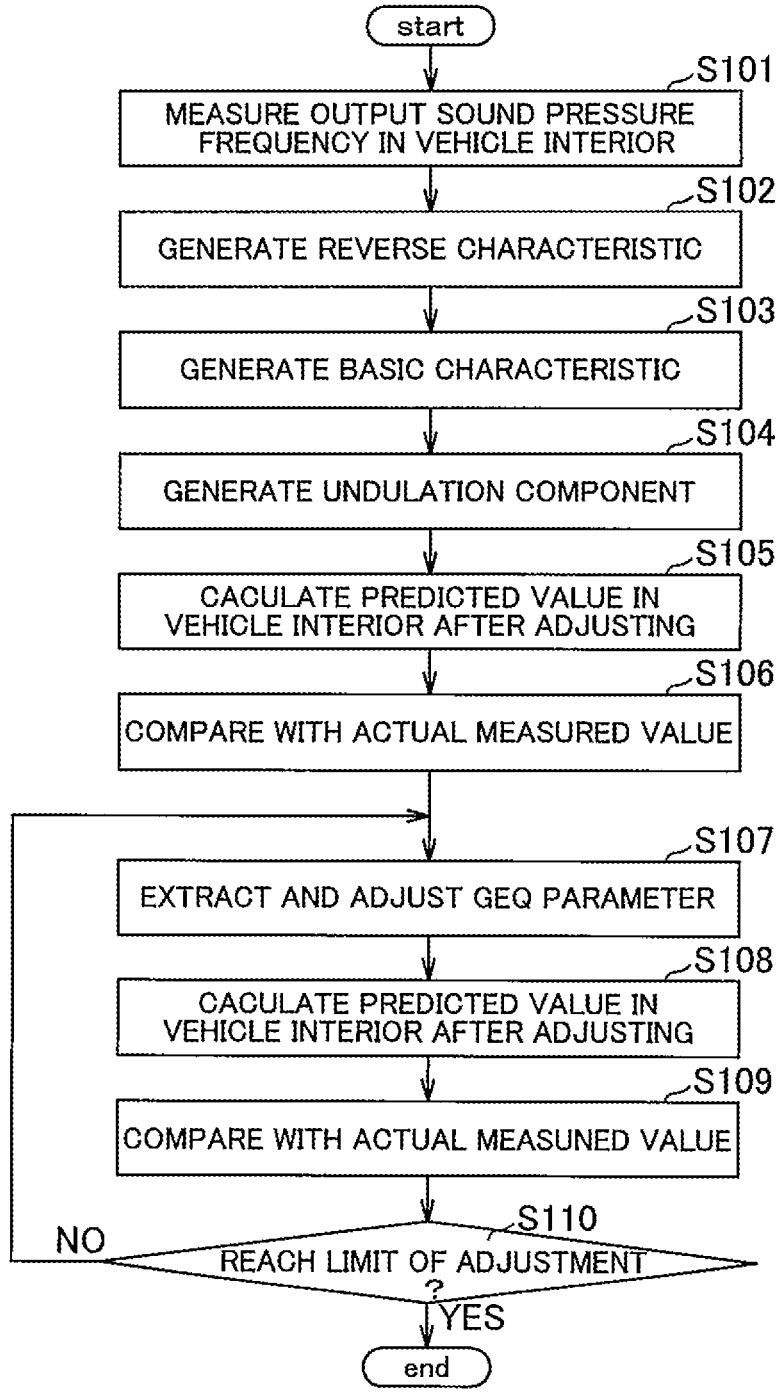
FIG. 13 is a flowchart of a method for adjusting the output sound pressure frequency characteristic of the sound-reproducing device shown in FIG. 12.

FIG. 13 shows a flowchart of the method for adjusting the output sound pressure characteristic in the vehicle interior of the embodiment of the present invention. First, in step S101, the output sound pressure frequency characteristic of the vehicle interior is measured. The measurement may be performed in a vehicle to be targeted or an environment virtually simulating a space of the vehicle interior.

Figure 14:
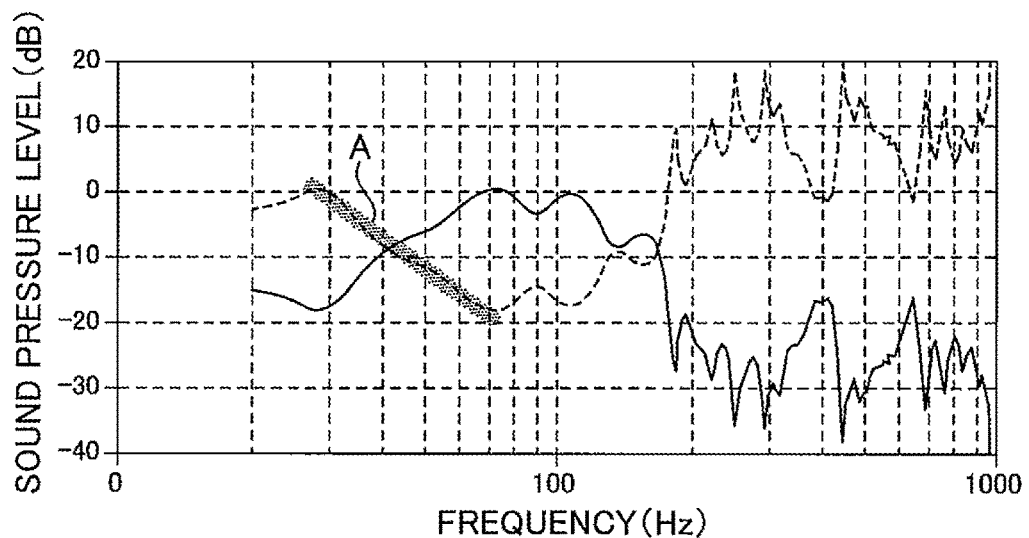
FIG. 14 is a graph comparing the output sound pressure frequency characteristic with the reverse characteristic in the vehicle interior.

Next, in step S102, the reverse characteristic of the output sound pressure frequency characteristic measured in step S101 is generated. FIG. 14 shows a graph comparing the output sound pressure frequency characteristic (solid line) measured in step S101 with the reverse characteristic (dashed line) generated in step S102. When the reverse characteristic of the output sound pressure frequency characteristic of the speaker unit 4 in the vehicle interior shown in FIG. 14 is compared with the reverse characteristic of the output sound pressure frequency characteristic of the speaker unit 4 in the free sound field shown in FIG. 2, the output sound pressure is gradually decreased as the frequency is raised in a range (10-80 Hz) of a prescribed frequency in the low frequency (A in FIG. 14). In other words, as compared with a slope of the reverse characteristic of the output sound pressure frequency characteristic of the speaker unit 4 in the free sound field, a slope of the reverse characteristic of the output sound pressure frequency characteristic of the speaker unit 4 in the vehicle interior is small in the range (10-80 Hz) of the prescribed frequency in the low frequency. Here, in the embodiment of the present invention, the low frequency indicates about 10-80 Hz, while it indicates a range of a few hundred Hz or less depending on the characteristic of the speaker unit 4. Further, the slope of the reverse characteristic of the output sound pressure frequency characteristic illustrates the degree of lowering of the output sound pressure shown in the reverse characteristic of the output sound pressure frequency characteristic in the range (10-80 Hz) of the prescribed frequency in the low frequency. More specifically, the slope of the reverse characteristic of the output sound pressure frequency characteristic is a slope of a straight line indicated by 'A' shown in FIG. 14.

The slope is caused by a variation of the output sound pressure frequency characteristic of the speaker unit 4. In a case of the free sound field, the output sound pressure level declines drastically as the frequency is lowered in the low frequency, while in a case of the vehicle interior (pressure sound field), it gradually declines. From this point, it is not desirable to use the reverse characteristic generated in the free sound field in the vehicle interior as it is. Further, such difference can generate and compare the reverse characteristic of the speaker unit 4 in both the free sound field and the vehicle interior by measuring the output sound pressure frequency characteristic of the speaker unit 4 in the free sound field and the output sound pressure frequency characteristic of the same speaker unit 4 in the vehicle interior. Therefore, it is possible to judge whether the slope is gradual (small) or not easily.

Figure 15:
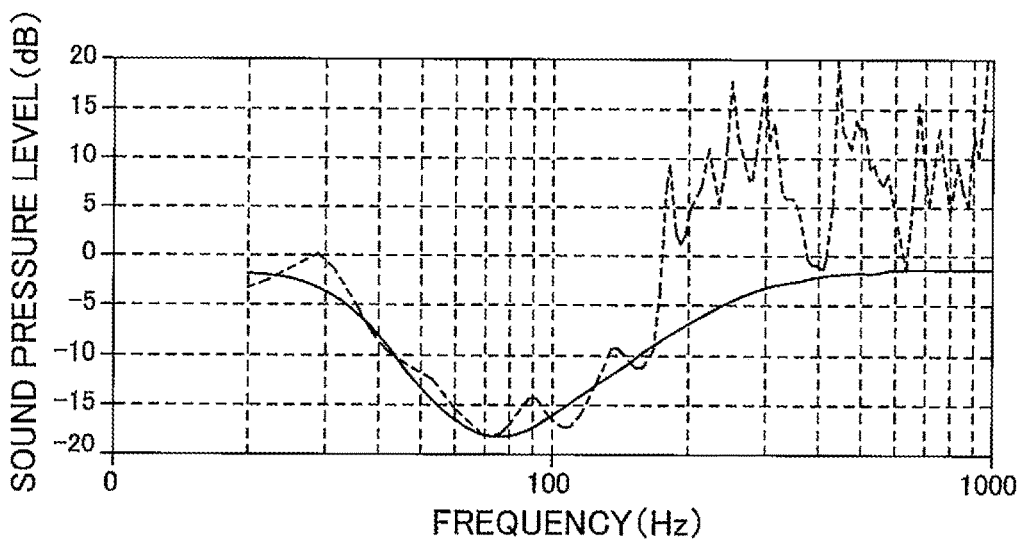
FIG. 15 is a graph comparing basic characteristic information with the reverse characteristic.

Next, in step S103, a base characteristic is generated. FIG. 15 shows a graph comparing a base characteristic (solid line) and the reverse characteristic (dashed line). The base characteristic is a reverse characteristic before considering the undulation component. That is, the base characteristic is a reverse characteristic actually added to the input signal in the DSP 12. In the embodiment of the present invention, as shown in FIG. 15, the base characteristic is a waveform drawing a curve shown in FIG. 15 so as to become a shelving low (SHL) type and shelving high (SHH) type filter in the DSP 12.

Figure 16:
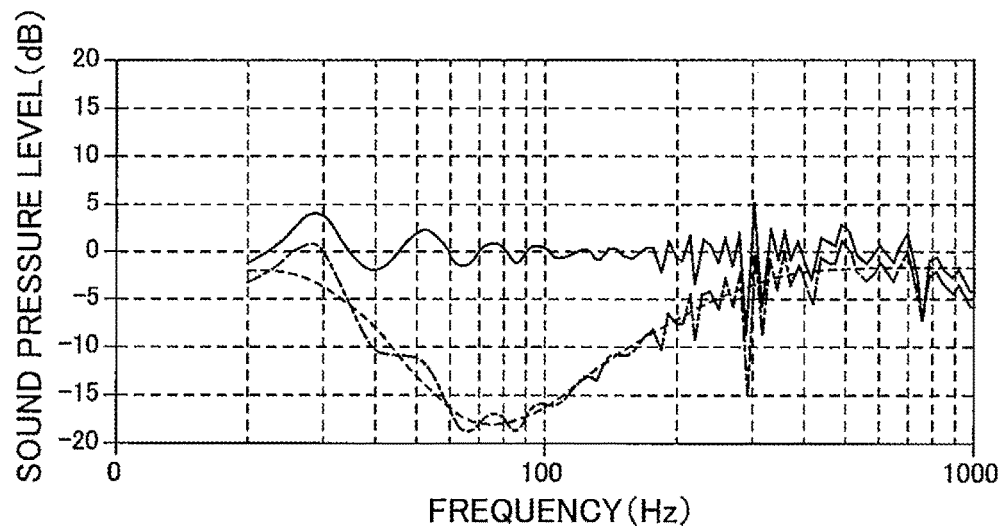
FIG. 16 is a graph comparing undulation component information, base characteristic information, and an adjusted value adding the undulation component information.
Figure 17:
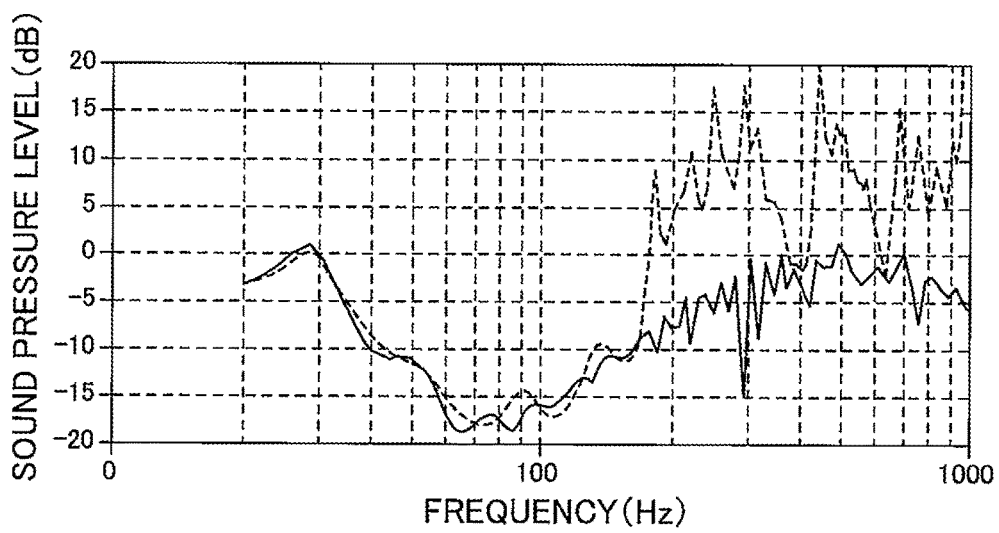
FIG. 17 is a graph comparing the adjusted value after adding the undulation component information with the reverse characteristic.

Next, in step S102, the undulation component is generated. As explained in FIGS. 8 to 11, firstly, the undulation component is generated from a difference between the output sound pressure frequency characteristic performing an adjustment of the reverse characteristic measured in the free sound field and the output sound pressure frequency characteristic performing the first adjustment of the reverse characteristic measured in the vehicle interior. FIG. 16 shows a graph comparing undulation component information (solid line), base characteristic (dashed line), and an adjusted value (one-dot chain line) adding the undulation component to the base characteristic. FIG. 17 shows a graph comparing the adjusted value (solid line) adding the undulation component to the base characteristic and the reverse characteristic (dashed line) shown in FIG. 14. In FIG. 17, a waveform in about 100 Hz or less is close to that of the reverse characteristic (dashed line). That is, the undulation component becomes correction information based on the output sound pressure frequency characteristic in the vehicle interior.

Figure 18:
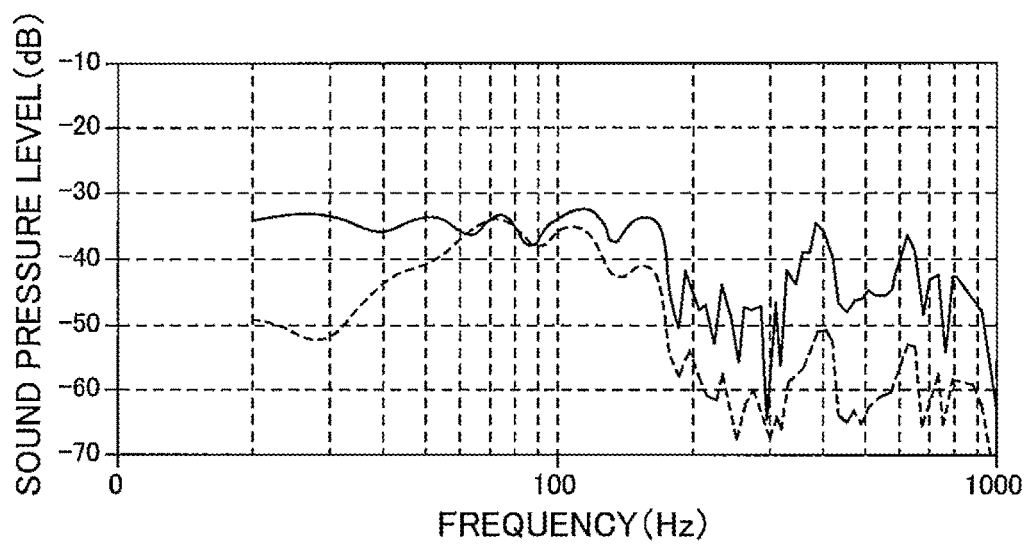
FIG. 18 is a graph comparing a predicted value in the vehicle interior after adjusted with a characteristic in the vehicle interior before adjusted.

Next, in step S105, a predicated value in the vehicle interior after adjusted by adding the undulation component to the base characteristic generated by step S104 is calculated. FIG. 18 shows a graph comparing the predicated value (solid line) after adjusted by adding the undulation component to the base characteristic and a characteristic in the vehicle interior before adjusted by adding the undulation component to the base characteristic. As shown in FIG. 18, the predicated value in the vehicle interior after adjusted by adding the undulation component to the base characteristic comes close to flat since about 60 Hz or less is increased.

Figure 19:
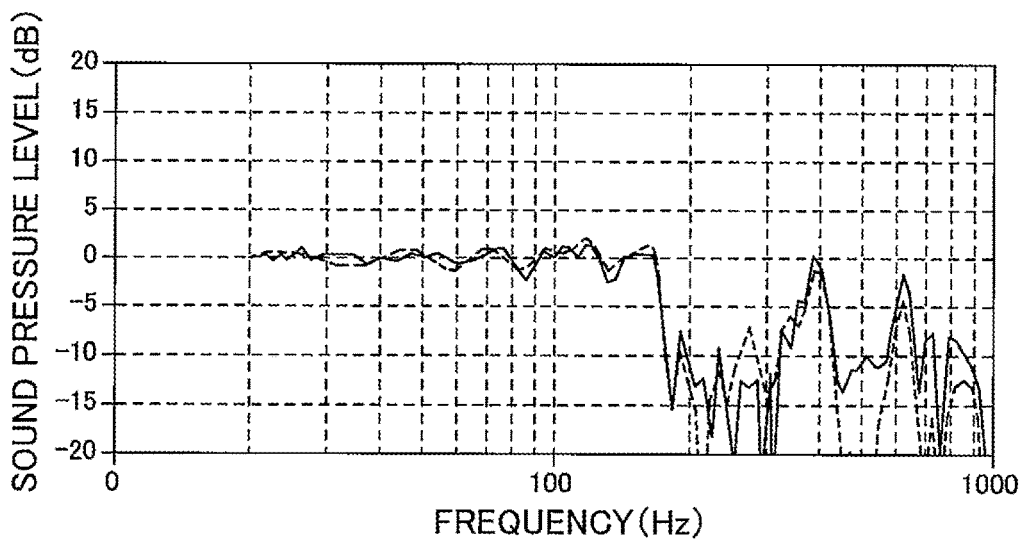
FIG. 19 is a graph comparing the predicted value in the vehicle interior after adjusted with an actual measured value.

Next, in step S106, the predicated value in the vehicle interior after adjusted shown in step S105 (FIG. 18) is compared with a result (actual measured value) actually adjusted by adding the undulation component to the base characteristic. FIG. 19 shows a graph comparing the predicted value (solid line) in the vehicle interior after adjusted shown in step S105 (FIG. 18) and the actual measured value (dashed line). As shown in FIG. 19, both the predicted value and the actual measured value come close to flat in about 100 Hz or less. In the meantime, since there is slight variation in the output sound pressure, it is found that there is room to make adjustments.

Figure 21:
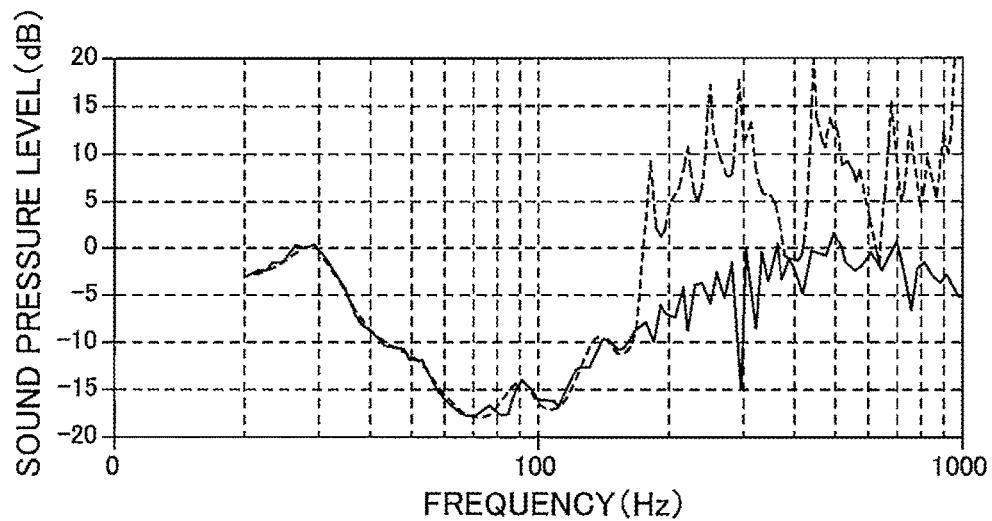
FIG. 21 is a graph comparing an adjusted value after adjusted via the graphic equalizer by using a parameter shown in FIG. 20 with the reverse characteristic.

Next, in step S107, a parameter is extracted so as to further perform an adjustment by the graphic equalizer 14 for the result adjusted by adding the undulation component to the base characteristic, and a fine adjustment is performed based on the parameter by the graphic equalizer 14. In FIG. 20, an example of the parameter is shown. FIG. 20A is an example of a fine adjustment of every ⅓ octave, and FIG. 20B is an example of a fine adjustment of every ⅙ octave. FIG. 21 shows a graph comparing the adjusted value after fine adjusted with the parameter shown in FIG. 20 by the graphic equalizer and the reverse characteristic (dashed line) shown in FIG. 14. In FIG. 21, a waveform in 100 Hz or less is closer to that of the reverse characteristic than FIG. 17.

Figure 22:
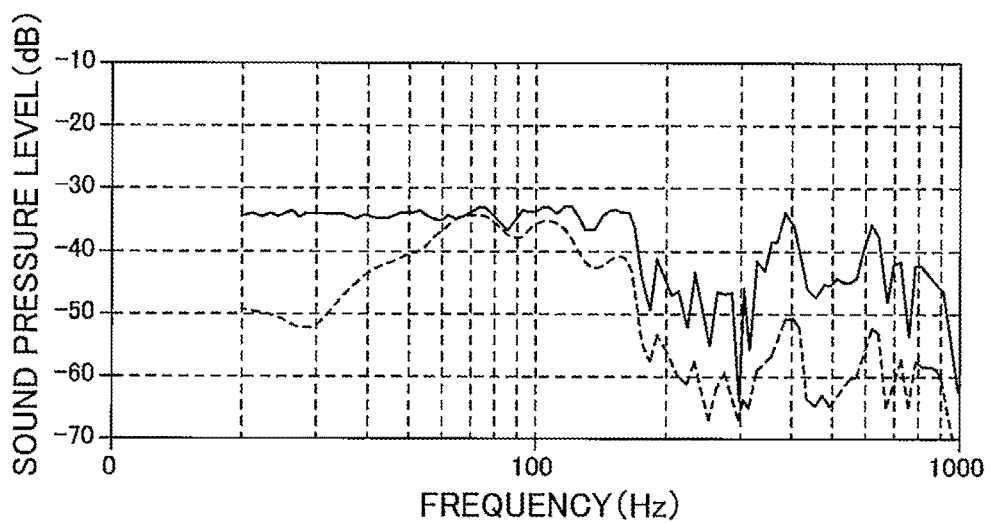
FIG. 22 is a graph comparing the predicted value in the vehicle interior after adjusted and the characteristic in the vehicle interior before adjusted.

Next, in step S108, the predicted value in the vehicle interior after fine adjusted by the graphic equalizer 14 performed in step S107 is calculated. FIG. 22 shows a graph comparing the predicted value (solid line) in the vehicle interior after fine adjusted and the characteristic (dashed line) in the vehicle interior before fine adjusted. As shown in FIG. 22, in the predicted value in the vehicle interior after fine adjusted, the output sound pressure frequency characteristic in about 60 Hz or less comes closer to flat than that before fine adjusted by the graphic equalizer 14 in FIG. 18.

Figure 23:
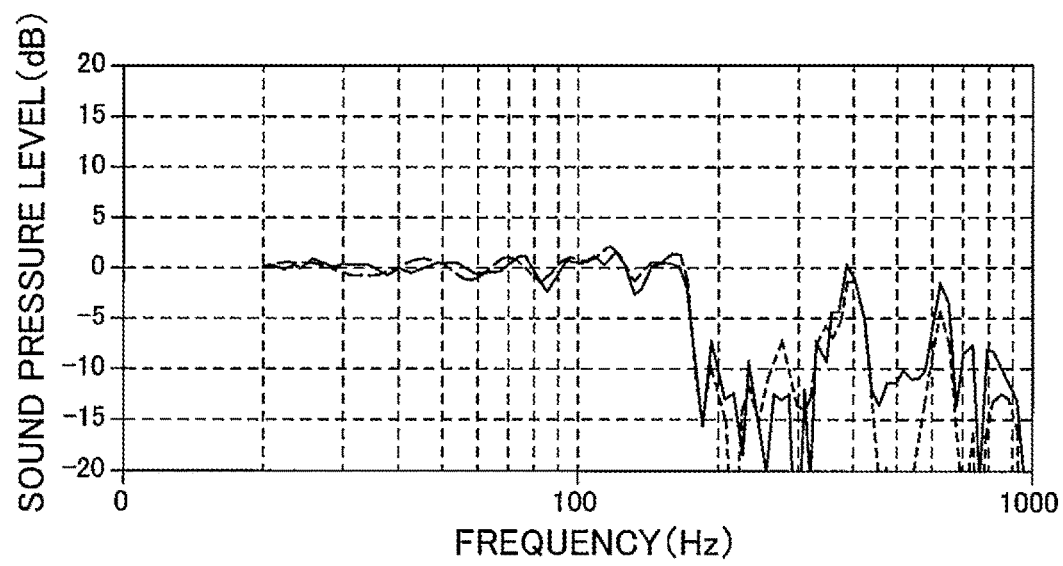
FIG. 23 is a graph comparing the predicted value in the vehicle interior after adjusted with an actual measured value.

Next, in step S109, the predicated value in the vehicle interior after fine adjusted by the graphic equalizer 14 is compared with the result (actual measured value) actually fine adjusted by the graphic equalizer 14 in the vehicle interior. FIG. 23 shows a graph comparing the predicted value (solid line) in the vehicle interior after fine adjusted and an actual measured value (dashed line).

Next, in step S110, it is determined whether the fine adjustment by the graphic equalizer 14 reaches a limit or not. When the fine adjustment reach a limit (in case of YES), the fine adjustment is finished. On the other hand, when the fine adjustment does not reach a limit (in case of NO), the processing returns to step S107, and the fine adjustment is performed by the graphic equalizer 14 (again extracting the parameter). The limit of the fine adjustment by the graphic equalizer 14 is a state that the previous measured value after fine adjusted the current measured value are hardly changed even if steps S107 to S109 are repeated. In this case, it is determined as improvement of the characteristic cannot be expected although further fine adjusted, and the processing is finished. After executing this flowchart, the adjustment results (base characteristic, undulation component, and parameter of the graphic equalizer 14) obtained is set to the DSP 12 and the graphic equalizer 14, respectively.

Further, after the adjustment result is set, the input signal of the sound-reproducing device 10A is calculated by the DSP 12 based on the base characteristic and the undulation component which are generated by the flowchart of FIG. 13. Then, a result calculated by the DSP 12 is fine adjusted based on the parameter to which the graphic equalizer 14 is set, and the adjusted result is outputted to the AMP 13.

Also, in the flowchart shown in FIG. 13, a specific vehicle type as a target is explained. However, output sound pressure characteristics of a plurality of vehicle types may be measured in step S101, and next steps may be performed based on an average value of the output sound pressure characteristics. Alternatively, the same adjustment may be performed based on the output sound pressure characteristics of every seat position or average output sound pressure characteristic of all seats.

Further, in the flowchart shown in FIG. 13, the fine adjustment is performed by the graphic equalizer 14, but this fine adjustment is not required. It is possible to finish the processing after generating the undulation component. Although the graphic equalizer 14 is not arranged, it is effective because effects of the undulation component can be reduced. In other words, it is possible to apply it to the structure shown in FIG. 1.

According to the embodiment of the present invention, the adjustment is performed by adding the undulation component due to influence of standing wave in the vehicle interior to the reverse characteristic of the output sound pressure frequency characteristic. Thereby, a correction can be performed in view of the reverse characteristic based on the characteristic of the speaker unit 4 as well as influence of standing wave due to a vehicle shape. Therefore, when the speaker unit 4 is mounted on the vehicle, the frequency characteristic of the speaker unit 4 can come close to flat.

Furthermore, in the embodiment described above, only the reverse characteristic of one of the speaker unit 4 is stored in the DSP 12, but the reverse characteristics of a plurality of types of speaker units may be stored. Moreover, according to the connecting speaker unit, it may be switched by a switch or switching unit such as a switching signal from an outside. Alternatively, it may be switched between default reverse characteristic and a reverse characteristic corresponding to a space in which the above described speaker unit 4 is installed.

Further, a signal in which a calculation processing is previously performed by the DSP 12 may be previously stored in a memory. The signal may be read from the memory, and be outputted to the speaker unit via an amplifier. In this case, the arithmetic device and the amplifying device are arranged and function separately. Such structure is also included in the present invention.

Further, a mobile object is not limited to a vehicle such as automobile. It is applicable as long as it has a space (pressure space) in which the surroundings of an aircraft, a ship or the like are covered with walls.

Further, the present invention is not limited to the embodiments described above. Namely, a person skilled in the art can carry out the present invention by modifying the embodiments within the subject matter of the present invention in accordance with the conventional well-known knowledge. The modification of the present invention is also encompassed by the present invention as long as the modification has the sound-reproducing device according to the present invention.

REFERENCE SIGNS LIST 4 speaker unit
10, 10A sound-reproducing device
11 μCom (arithmetic device)
12 DSP (arithmetic device)
13 AMP (amplification section)

What is claimed is:

1. A sound-reproducing device comprising:
an arithmetic device calculating an input signal; and
an amplifying device amplifying the calculated signal and outputting the signal to a speaker unit,
wherein the arithmetic device superimposes a reverse characteristic of an output sound pressure frequency characteristic of the speaker unit in a vehicle interior on the input signal, and
the arithmetic device adds correction information based on the output sound pressure frequency characteristic of the speaker unit in the vehicle interior to the reverse characteristic.

2. The sound-reproducing device according to claim 1, wherein the arithmetic device cuts a part of the output sound pressure frequency characteristic in a low frequency.

3. The sound-reproducing device according to claim 2, wherein an upper limit frequency value in the part of the output sound pressure frequency characteristic to be cut decreases as an amplification factor of the amplifying device decreases.

4. The sound-reproducing device according to claim 2, wherein an upper limit frequency value in the part of the output sound pressure frequency characteristic to be cut is 100 Hz.

5. The sound-reproducing device according to claim 1, wherein a slope of the reverse characteristic of the output sound pressure frequency characteristic of the speaker unit in the vehicle interior is smaller than a slope of the reverse characteristic of the output sound pressure frequency characteristic of the speaker unit in a free sound field in a predetermined low frequency range.

6. A mobile object comprising the sound-reproducing device according to claim 1.

7. A reproducing method of a sound-reproducing device, the reproducing method comprising:
a calculation process for performing a calculation of an input signal; and
an amplification process for amplifying the calculated signal via an amplifying device and outputting the signal to a speaker unit,
wherein the calculation process performs a calculation for superimposing a reverse characteristic of an output sound pressure frequency characteristic of the speaker unit in a vehicle interior on the input signal, and
the calculation process adds correction information based on the output sound pressure frequency characteristic of the speaker unit in the vehicle interior to the reverse characteristic.

8. The reproducing method of the sound-reproducing device according to claim 7, wherein the calculation process cuts a part of the output sound pressure frequency characteristic in a low frequency.

9. A reproduction program of a sound-reproducing device that makes a computer execute the reproducing method according to claim 6.

10. A storage medium readable by a computer, wherein the storage medium stores the reproduction program of the sound-reproducing device according to claim 9.

11. The sound-reproducing device according to claim 3, wherein the upper limit frequency value in the part of the output sound pressure frequency characteristic to be cut is 100 Hz.

12. The reproducing method of the sound-reproducing device according to claim 8, wherein an upper limit frequency value in the part of the output sound pressure frequency characteristic to be cut decreases as an amplification factor of the amplifying device decreases.

13. The reproducing method of the sound-reproducing device according to claim 8, wherein an upper limit frequency value in the part of the output sound pressure frequency characteristic to be cut is 100 Hz.

* * * * *